United States Patent
Lee et al.

(10) Patent No.: US 10,497,800 B2
(45) Date of Patent: Dec. 3, 2019

(54) SKYRMION DIODE AND METHOD OF MANUFACTURING THE SAME

(71) Applicant: UNIST (Ulsan National Institute of Science and Technology), Ulju-gun, Ulsan (KR)

(72) Inventors: Ki Suk Lee, Ulsan (KR); Dae Han Jeong, Ulsan (KR); Hee Sung Han, Ulsan (KR); Nam Kyu Kim, Ulsan (KR)

(73) Assignee: UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 0 days.

(21) Appl. No.: 15/431,488

(22) Filed: Feb. 13, 2017

(65) Prior Publication Data
US 2017/0256633 A1 Sep. 7, 2017

(30) Foreign Application Priority Data
Mar. 7, 2016 (KR) .................. 10-2016-0026930

(51) Int. Cl.
*H01L 29/66* (2006.01)
*H01L 29/30* (2006.01)
*H01L 29/82* (2006.01)
*G11C 11/16* (2006.01)
*H01L 43/00* (2006.01)

(52) U.S. Cl.
CPC ...... *H01L 29/66984* (2013.01); *G11C 11/161* (2013.01); *G11C 11/1659* (2013.01); *G11C 11/1675* (2013.01); *H01L 29/30* (2013.01); *H01L 29/82* (2013.01); *H01L 43/00* (2013.01)

(58) Field of Classification Search
CPC .............. H01L 29/66984; H01L 29/82; G11C 11/1675; G11C 11/1659; G11C 11/161
See application file for complete search history.

(56) References Cited

U.S. PATENT DOCUMENTS 9,502,090 B2 * 11/2016 Lew .................... G11C 11/16
9,741,420 B2 * 8/2017 Nagaosa ............... G11C 11/16
(Continued)

OTHER PUBLICATIONS

Bram van Dijk, Skyrmions and the Dzyaloshinskii-Moriya Interaction, Utrecht University, Dec. 2014.*
(Continued)

*Primary Examiner* — Cuong Q Nguyen
*Assistant Examiner* — Shih Tsun A Chou
(74) *Attorney, Agent, or Firm* — Fenwick & West LLP

(57) ABSTRACT

The present disclosure provides a skyrmion diode using skyrmions as information carriers. The skyrmion diode includes a magnetic body and a conductive body. The magnetic body has a skyrmion which is used as information carrier. The conductive body is disposed on or under the magnetic body. The conductive body includes a Dzyaloshinskii-Moriya interaction (DMI) region and a defect region. The DMI region is provided to induce DMI in a region of the magnetic body corresponding to the DMI region by the spin-orbit coupling of the conductive body and magnetic moments of the magnetic body. The defect region is provided to prevent the DMI from being induced in a region of the magnetic body corresponding to the defect region.

3 Claims, 4 Drawing Sheets

(56) References Cited

U.S. PATENT DOCUMENTS

| | | | |
|---|---|---|---|
| 9,859,017 B2* | 1/2018 | Nagaosa | G11C 19/0866 |
| 2016/0314827 A1* | 10/2016 | Cros | G11C 11/16 |
| 2017/0018297 A1* | 1/2017 | Zang | G11C 11/1675 |
| 2017/0076772 A1* | 3/2017 | Andrikopoulos | G11C 11/1673 |
| 2017/0169898 A1* | 6/2017 | Nagaosa | G11C 19/085 |
| 2017/0178748 A1* | 6/2017 | Nagaosa | G11C 19/0866 |
| 2017/0179375 A1* | 6/2017 | Nagaosa | H01L 43/02 |
| 2017/0256351 A1* | 9/2017 | Cros | H01F 10/324 |

OTHER PUBLICATIONS

Junichi Iwasaki, et al., Current-induced skyrmion dynamics in constricted geometries, Nature Nanotechnology, Sep. 2013.*
Fook et al., Gateable Skyrmion Transport via Field-induced Potential Barrier Modulation, Scientific Reports, Feb. 17, 2016.*
Fert et al., Skyrmions on the track, Nature Nanotechnology, vol. 8, Mar. 2013, pp. 152-156.*

* cited by examiner

SKYRMION DIODE AND METHOD OF MANUFACTURING THE SAME

CROSS-REFERENCE TO RELATED APPLICATION

This application claims the benefit of Korean Patent Application No. 10-2016-0026930, filed on Mar. 7, 2016, which is incorporated herein by reference in its entirety.

TECHNICAL FIELD

The present disclosure relates to a skyrmion diode, more particularly, to a skyrmion diode using skyrmions as information carriers and a method of manufacturing the skyrmion diode.

BACKGROUND

As well known in the art, semiconductor technology so far has been developed according to Moore's law. However, quantum phenomena occur as feature sizes of semiconductor devices are continuously scaled down, and therefore, a design rule that has been previously employed has to be changed.

New challenges and approaches have been attempted to break away from silicon-based device concepts in consideration of, e.g., heat problems due to drastic increases in power consumption, slowing of information processing speed, and rapid increase in manufacturing equipment and process costs. In this connection, various studies and researches have been devoted to overcome the current technical limitations.

For example, conventionally, there is disclosed 'a method of generating and erasing skyrmion and magnetic element' in Japanese Patent Application Publication No. 2014-175417 (published on Sep. 22, 2014).

In this conventional case, corners are provided in a magnetic body having a skyrmion phase, and skyrmion is generated by applying current across the corners in a state where a magnetic field is applied in a predetermined intensity range.

However, since the magnetic body has to be formed in a shape having the corners, a limited manufacturing process such as a slurry molding can only be used. Further, electrical characteristics vary depending on the shape, size or position of the corner, but it is difficult to perform a fine adjustment for the electrical characteristics, which is problematic.

SUMMARY

In view of the above, the present disclosure provides a skyrmion diode using skyrmions as information carriers without providing corners in a magnetic body having the skyrmions and a method of manufacturing the skyrmion diode.

In accordance with an aspect of the present disclosure, there is provided a skyrmion diode including a magnetic body and a conductive body. The magnetic body may have a skyrmion which is used as an information carrier. The conductive body may be disposed on or under the magnetic body. The conductive body may include a Dzyaloshinskii-Moriya interaction (DMI) region and a defect region. The DMI region is provided to induce DMI in a region of the magnetic body corresponding to the DMI region by spin-orbit coupling of the conductive body and magnetic moments of the magnetic body. The defect region is provided to prevent the DMI from being induced in a region of the magnetic body corresponding to the defect region.

Further, spin-polarized current may be supplied to at least one of the magnetic body and the conductive body. The defect region may be formed by forming a notch portion at a side portion of the conductive body. The notch portion may have a semicircular shape, a triangular shape or a rectangular shape.

In accordance with another aspect of the present disclosure, there is provided a method of manufacturing a skyrmion diode, the method including: forming a magnetic body including a skyrmion, which is used as an information carrier; forming a conductive body having spin-orbit coupling on or under the magnetic body; and forming a defect region in a part of the conductive body, which prevents Dzyaloshinskii-Moriya interaction (DMI) induced by the spin-orbit coupling and magnetic moments of the magnetic body from being induced in a region of the magnetic body corresponding to the defect region.

Herein, the defect region may be formed by forming a notch portion at a side portion of the conductive body. The notch portion may have a semicircular shape, a triangular shape or a rectangular shape.

The skyrmion diode according to the aspects of the present disclosure employs a conductive body including the DMI region for inducing the DMI in the magnetic body and the defect region for preventing the DMI from being induced in the magnetic body. Therefore, the skyrmion is used as an information carrier without providing corners in the magnetic body.

With such configuration, various manufacturing processes can be introduced since the conductive body can be easily manufactured in various shapes as compared with the magnetic body. Further, there can be easily performed a fine adjustment of the defect region in which the electrical characteristics are varied depending on its shape, size or position.

DETAILED DESCRIPTION

The advantages and features of the present disclosure and the method for accomplishing them will be clearly understood from the following detailed description of the embodiments taken in conjunction with the accompanying drawings. However, the present disclosure is not limited to those embodiments disclosed herein below, but may be implemented in various forms. It should be noted that the embodiments are provided to make a full disclosure of the present disclosure and also to allow those skilled in the art to know the full scope of the present disclosure. Therefore, the present disclosure will be defined only by the scope of the appended claims.

In the following description, well-known functions and/or constitutions will not be described in detail if they would unnecessarily obscure the features of the present disclosure in unnecessary detail. Further, the terms to be described below are defined in consideration of their functions in the embodiments of the present disclosure and may vary depending on user's or operator's intention or practice. Accordingly, the definition may be made on the basis of the content throughout the specification.

Hereinafter, preferred embodiments of the present disclosure will be described in detail with reference to the accompanying drawings.

Figure 1:
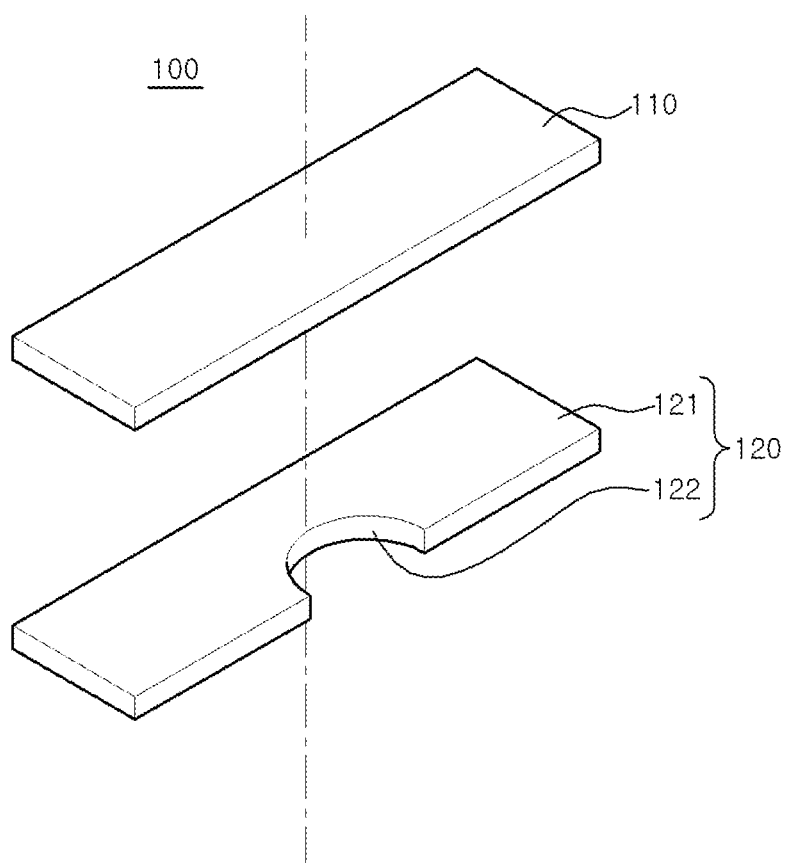
FIG. 1 is an exploded perspective view of an exemplary skyrmion diode according to one embodiment.
Figure 2:
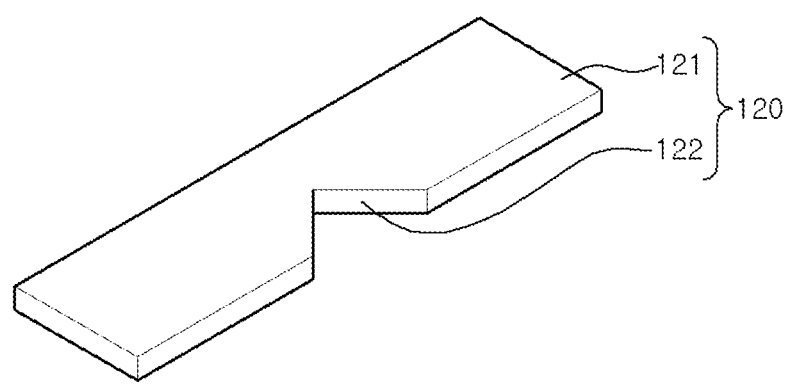
FIG. 2 is a perspective view of an exemplary conductive body according to one embodiment.
Figure 3:
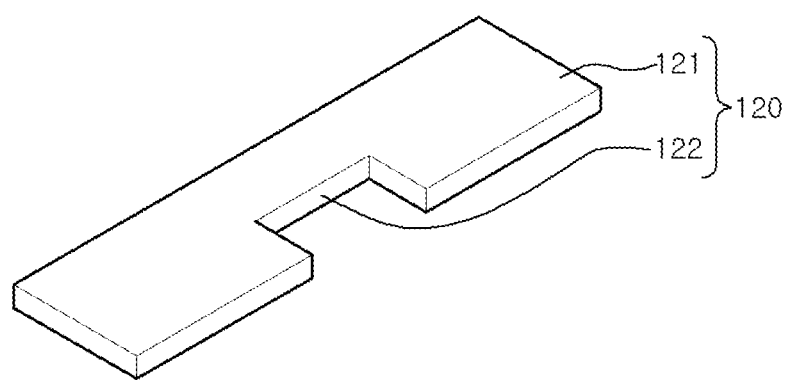
FIG. 3 is a perspective view of an exemplary conductive body according to another embodiment.

FIG. 1 is an exploded perspective view of an exemplary skyrmion diode according to one embodiment. FIG. 2 is a perspective view of an exemplary conductive body according to one embodiment. FIG. 3 is a perspective view of an exemplary conductive body according to another embodiment. As shown in FIGS. 1 to 3, a skyrmion diode 100 includes a magnetic body 110 and a conductive body 120.

The magnetic body 110 is disposed on or under the conductive body 120 and has a skyrmion serving as an information carrier.

When spin-polarized current is supplied to at least one of the magnetic body 110 and the conductive body 120, spin-transfer torque is generated to move the skyrmion. In addition, since the conductive body 120 has strong spin-orbit coupling, spin-orbit torque can be generated by a spin Hall effect or a rashba effect to thereby move the skyrmion.

The conductive body 120 includes a Dzyaloshinskii-Moriya interaction (DMI) region 121 for inducing DMI in a region of the magnetic body 110 corresponding to the DMI region 121 by magnetic moments of the magnetic body 110 and a spin-orbit coupling of the conductive body 120. Further, the conductive body 120 includes a defect region 122 to prevent the DMI from being induced in a region of the magnetic body 110 corresponding to the defect region 122 (that is, a region of the magnetic body 110 other than the region corresponding to the DMI region) in spite of the magnetic moments of the magnetic body 110 and the spin-orbit coupling of the conductive body 120.

The defect region 122 may be formed by forming a notch portion at a side portion of the conductive body 120. For example, the notch portion is formed by cutting away a part of a longitudinal side portion of the conductive body 120 having a rectangular shape and is positioned on a left longitudinal side portion or a right longitudinal side portion of FIG. 1 depending on the diode characteristic of e.g., a forward direction or a reverse direction. Further, the notch portion may be formed in a semicircular shape as shown in FIG. 1 or a triangular shape as shown in FIG. 2. Alternatively, the notch portion may be formed in a rectangular shape as shown in FIG. 3.

Figure 4:
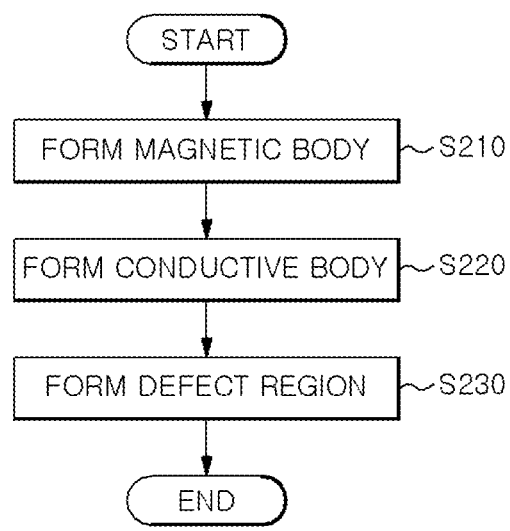
FIG. 4 is a flow chart illustrating an exemplary method of manufacturing the skyrmion diode according to one embodiment.

FIG. 4 is a flow chart illustrating an exemplary method of manufacturing the skyrmion diode according to one embodiment, wherein the magnetic body 110 is formed first.

In the method, a step S210 of forming the magnetic body 110 is carried out first. For example, the magnetic body 110 can be formed by using a process such as a slurry molding. An alloy-based magnetic material such as a cobalt-iron (CoFe) alloy, a cobalt-iron-boron (CoFeB) alloy or the like, or a Heusler alloy-based magnetic material such as a cobalt-ferrosilicon ($Co_2FeSi$) alloy, a cobalt-manganese-silicon ($Co_2MnSi$) alloy or the like can be used to form the magnetic body 110.

Then, a step S220 of forming the conductive body 120 on or above the magnetic body 110 is carried out. For example, the conductive body 120 can be formed by using a process such as a sputtering, a molecular beam epitaxy (MBE), an atomic layer deposition (ALD), a pulse laser deposition (PLD), or an E-beam evaporator. A heavy metal such as platinum (Pt), tantalum (Ta), iridium (Ir) or the like may used to form the conductive body 120.

Next, a step S230 of forming the defect region 122 in the conductive body 120 is carried out to prevent the DMI from being induced in the region of the magnetic body 110 corresponding to the defect region 122 in spite of the magnetic moments of the magnetic body 110 and the spin-orbit coupling of the conductive body 120. For example, the defect region 122 may be formed by forming a notch portion at a side portion of the conductive body 120 through a photo etching process. The notch portion may be formed in, e.g., a semicircular shape, a triangular shape, or a rectangular shape. The electrical performance of the skyrmion diode 100 may be controlled by adjusting at least one of the shape, size and position of the notch portion.

The skyrmion diode 100 according to one embodiment includes the magnetic body 110 disposed on or under the conductive body 120, and a skyrmion in the magnetic body 110 can be moved by spin polarized current. Further, since the skyrmion moves only through the region where the DMI is induced, the region of the magnetic body 110 corresponding to the DMI region 121 serves as a waveguide. When the skyrmion moving through the waveguide reach the region of the magnetic body 110 where no DMI is induced due to the defect region 122, there occurs an interaction which causes the skyrmion to selectively turn around the defect region 122 in a specific direction, e.g., in a clockwise or counterclockwise direction based a spin orientation. Based on this interaction, the diode characteristics can be realized by allowing current-induced skyrmion to flow and move in one direction.

Figure 5:
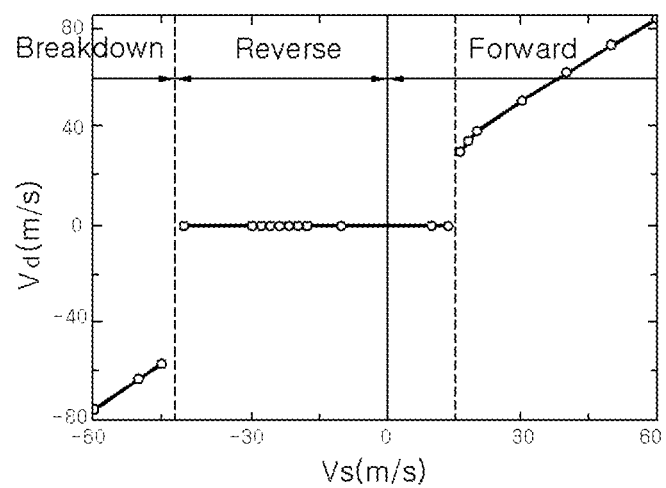
FIG. 5 is a graph showing the diode characteristics.

FIG. 5 is a graph showing the diode characteristics. A horizontal axis (X-axis) indicates conduction electron velocity Vs (m/s) and a vertical axis (Y-axis) indicates skyrmion velocity Vd (m/s). If the intensity of the current corresponding to the conduction electron velocity is larger than that of a critical current, the skyrmion becomes an ON state where it can pass by the defect region. If the intensity of the current corresponding to the conduction electron velocity is smaller than that of the critical current, the skyrmion becomes an OFF state where it cannot pass by the defect region. Further, as shown in FIG. 5, it can be seen that the intensity of the critical current in the forward direction is different from the intensity of the critical current in the reverse direction.

The explanation as set forth above merely provides a technical idea of the present disclosure, and it will be understood by those skilled in the art to which the present disclosure belongs that various changes and modifications may be made without departing from the scope of the characteristics of the present disclosure. Therefore, the embodiments disclosed in the present disclosure are not used to limit the technical idea of the present disclosure, but to explain the present disclosure, and the scope of the technical idea of the present disclosure is not limited to these embodiments.

The scope of protection of the present disclosure should be construed as defined in the following claims, and all technical ideas that fall within the equivalent technical idea of the present disclosure are intended to be embraced by the scope of protection of the present disclosure.

What is claimed is:
1. A skyrmion diode comprising:
   a magnetic body including a skyrmion, the skyrmion serving as an information carrier; and
   a conductive body disposed on or under the magnetic body, wherein the conductive body has a notch portion at one side portion thereof, wherein the notch portion of the conductive body serves as a defect region for preventing a Dzyaloshinskii-Moriya interaction (DMI) from being induced in a region of the magnetic body corresponding to the notch portion, a remaining portion of the conductive body other than the notch portion serves as a DMI region for inducing the DMI in a region of the magnetic body corresponding to the remaining portion by spin-orbit coupling of the conductive body and magnetic moments of the magnetic body, and wherein the skyrmion in the magnetic body moves by a spin-polarized current only through the region of the magnetic body corresponding to the DMI region of the conductive body and the skyrmion selectively turn around the region of the magnetic body corresponding to the defect region of the conductive body in a direction based on a spin orientation to allow the skyrmion to have diode characteristics, wherein the magnetic body is provided without having the notch portion, and wherein the magnetic body covers the entire conductive body.

2. The skyrmion diode of claim 1, wherein the spin-polarized current is supplied to at least one of the magnetic body and the conductive body.

3. The skyrmion diode of claim 1, the notch portion has a semicircular shape, a triangular shape or a rectangular shape.

* * * * *